(12) United States Patent
Liu

(10) Patent No.: US 7,605,376 B2
(45) Date of Patent: Oct. 20, 2009

(54) CMOS SENSOR ADAPTED FOR DENTAL X-RAY IMAGING

(75) Inventor: Xinqiao Liu, Mountain View, CA (US)

(73) Assignee: Fairchild Imaging, Inc., Milpitas, CA (US)

( * ) Notice: Subject to any disclaimer, the term of this patent is extended or adjusted under 35 U.S.C. 154(b) by 0 days.

(21) Appl. No.: 11/926,453

(22) Filed: Oct. 29, 2007

(65) Prior Publication Data

US 2009/0108207 A1  Apr. 30, 2009

(51) Int. Cl.
*G01T 1/24* (2006.01)
(52) U.S. Cl. .............................. 250/370.09; 250/370.11
(58) Field of Classification Search ............ 250/370.09, 250/370.11
See application file for complete search history.

(56) References Cited

U.S. PATENT DOCUMENTS 5,796,153 A * 8/1998 Marcovici ................... 257/446
5,825,033 A * 10/1998 Barrett et al. ............. 250/370.1
2007/0069142 A1* 3/2007 Moody et al. .......... 250/370.09
2008/0135771 A1* 6/2008 Vydrin et al. .......... 250/370.09

FOREIGN PATENT DOCUMENTS

EP          1333661 A1 *   8/2003

* cited by examiner

*Primary Examiner*—Constantine Hannaher
(74) *Attorney, Agent, or Firm*—Calvin B. Ward

(57) ABSTRACT

An image sensor and a method for using the same to capture an x-ray image are disclosed. The image sensor includes an output bus, a two dimensional array of pixel sensors that receives light from a layer of scintillation material and a controller. Each pixel sensor includes a capacitor, a plurality of light sensors, a charge converter and a transfer gate. Each of the light sensors includes a photodiode and a photodiode transfer gate that connects the photodiode to the capacitor. During readout, the charge on selected ones of the photodiodes is transferred to the capacitor. The charge on the capacitor is converted to a signal that is coupled to the output bus through the transfer gate by the controller. The number of photodiodes that are connected to the capacitor during the readout can be controlled to assure that the charge converter does not saturate.

13 Claims, 6 Drawing Sheets

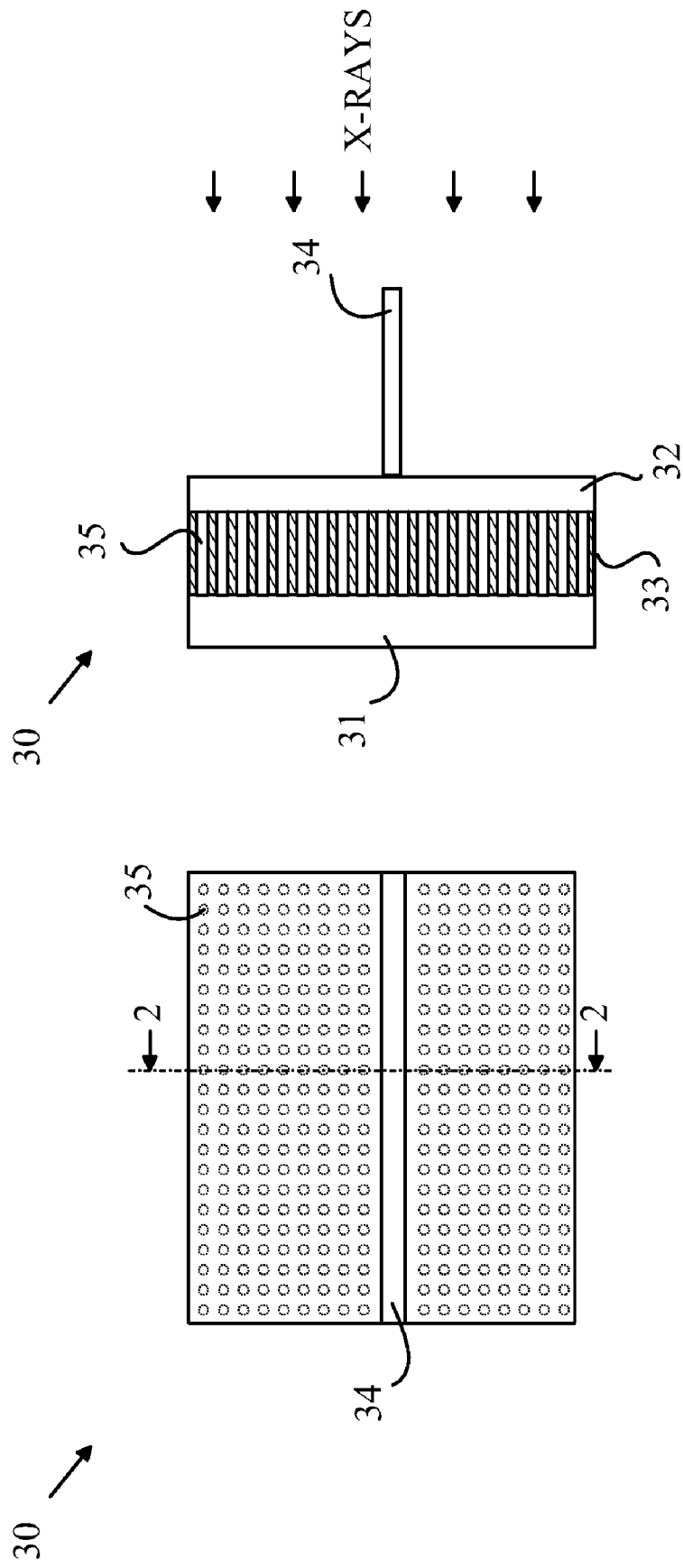

CMOS SENSOR ADAPTED FOR DENTAL X-RAY IMAGING

BACKGROUND OF THE INVENTION

Dental x-rays are typically taken with a film that is placed in the patient's mouth. The film is exposed through the teeth by an x-ray source that resides outside the patient's head. While this method has been in use for many years, it has a number of disadvantages. First, the patient is exposed to a significant dose of x-rays. This dose is accumulative over the patient's lifetime. Second, the time, cost, and equipment needed to process the film increases the cost of the dental examination. Third, the chemicals utilized in processing the film pose a disposal problem.

These problems have led to several attempts to replace the film component of the traditional x-ray examination with a solid-state sensor that is placed in the patient's mouth to record the x-ray image. In such systems, a layer of scintillation material is used to convert the x-rays to visible light. The visible light is then imaged onto a solid-state imaging array. Since solid-state x-ray sensors of this type are significantly more sensitive to x-rays than the films utilized today, the x-ray dosage can be reduced by typically a factor of 10. In addition, the sensor is re-used, and hence, the environmental problems associated with the conventional x-ray system are avoided. Finally, since the image is in digital form, systems based on solid-state sensors are easily adapted to paperless office systems.

CMOS imaging arrays typically include an array of pixel elements in which each element has a photodiode and an active gain stage. The photodiode generates and stores a charge that is related to the amount of light that was received by the photodiode during a predetermined exposure period. The active gain stage typically converts this charge to a voltage that is readout on a bus to a readout circuit that digitizes the voltage to provide the intensity value associated with the pixel in question.

In a conventional photographic application, the physical size of each pixel is set by considerations that are more or less independent of the images that are to be captured, since the camera using the imaging array includes a lens that matches the image to the size of the array. Hence, the conversion of a conventional film-based camera to a digital camera can be made with relatively few changes to the camera. For example, if the imaging array has a size that differs from that of the film that is being replaced, the magnification of the lens system can be changed to assure that the image covers the imaging array. In such applications, the number of pixels and the sensitivity of the array are the parameters of interest. Arrays with larger numbers of pixels provide images with finer detail. Similarly, arrays with higher sensitivity can be utilized in lower light situations. The cost of the array is determined by the size of the die on which the imaging array is constructed, larger dies being more expensive. The sensitivity of the array depends on the amount of silicon in each pixel that is devoted to the photodiode, as opposed to the active gain stage and other circuitry. Hence, cost, resolution, and sensitivity are traded against one another to arrive at an acceptable design.

In contrast, in dental applications, the size of the die is fixed by the geometry of the patient's mouth. A dental x-ray image is essentially the shadow of the teeth on the imaging surface. Hence, the imaging array must be large enough to capture the same area as the conventional x-ray film without any additional lens to compensate for size differences. The required resolution is likewise set by the x-ray imaging process, which has an inherent blurring function built into it. Hence, once the pixel size is below some threshold size that depends on the blurring, no significant improvement in image quality is obtained by further reducing the size of the pixels in the array. As a result of these considerations, the optimum pixel would be a square with a side of approximately 25 microns.

The preferred light-sensing element in CMOS imaging arrays is a "pinned" photodiode. The diode is doped such that the charge storage region of the photodiode is at a potential that is significantly higher than the input to the active circuitry that converts the stored charge to a voltage. This arrangement assures that all of the charge accumulated during the period in which the photodiode is exposed to light is removed during readout and reset processes. If any charge were to remain, the next image taken by the array could include a ghost of the previous image.

Unfortunately, constructing the pinned photodiodes of the desired size for x-ray imaging in conventional CMOS processes is difficult. Hence, conventional CMOS imaging arrays having larger numbers of pixels of a smaller size are used. In effect, the 25×25 micron area is broken up into a number of smaller pixels of a size that can be constructed in CMOS. The results from these pixels are then added together after the image is formed to provide an image that approximates the image that would have been formed using the larger pixel size.

Unfortunately, this approach has a number of problems. First, each pixel includes an active gain element and the gate circuitry associated with reading out the individual pixels on the readout buses. The added circuitry reduces the fill-factor of the pixel, i.e., the ratio of the photodiode area to the pixel area. Hence, sensitivity is lost, which leads to increased x-ray exposure times. Second, the readout time is increased. If the 25 micron pixels are broken into 5 micron pixels, then there are 25 times more pixels that must be readout. If the array is organized as a rectangular array with rows and columns of pixels, the number of rows is increased by a factor of 5, and hence, the readout time is increased by a factor of 5 even if an entire row is read in parallel by providing an analog-to-digital converter for each column of pixels. In addition, the increase in the number of columns leads to a significant increase in the number of ADCs needed to digitize the image, which further increases the cost of the dental sensor.

SUMMARY OF THE INVENTION

The present invention includes an image sensor and a method for using the same to capture an x-ray image. The image sensor includes an output bus, a two dimensional array of pixel sensors that receives light from a layer of scintillation material and a controller. Each pixel sensor includes a capacitor, a plurality of light sensors, a charge converter and a transfer gate. Each of the light sensors includes a photodiode and a photodiode transfer gate that connects the photodiode to the capacitor. During readout, the charge on selected ones of the photodiodes is transferred to the capacitor. The charge on the capacitor is converted to a signal that is coupled to the output bus through the transfer gate by the controller. The number of photodiodes that are connected to the capacitor during the readout can be controlled to assure that the charge converter does not saturate.

In another aspect of the invention, the number of photodiodes that contribute charge to the capacitor varies from pixel sensor to pixel sensor, and the number of photodiodes that contributed to the charge in each sensor is also output to allow a light intensity received by the light sensor to be computed from the signal generated by the charge converter.

In yet another aspect of the invention, the charge converter can generate a digital value representing the charge on the capacitor. The charge converter can include a comparator that compares a signal on the capacitor with a reference voltage, the comparator generating a stop signal when the signal voltage is in a predetermined relationship with the reference voltage, and a counter that counts pulses from a clock input until the stop signal is generated. The count value is output on the output bus.

BRIEF DESCRIPTION OF THE DRAWINGS

FIG. 1 is a top view of prior art dental sensor 30.

FIG. 2 is a cross-sectional view through line 2-2 shown in FIG. 1.

DETAILED DESCRIPTION OF THE PREFERRED EMBODIMENTS

Figure 3:
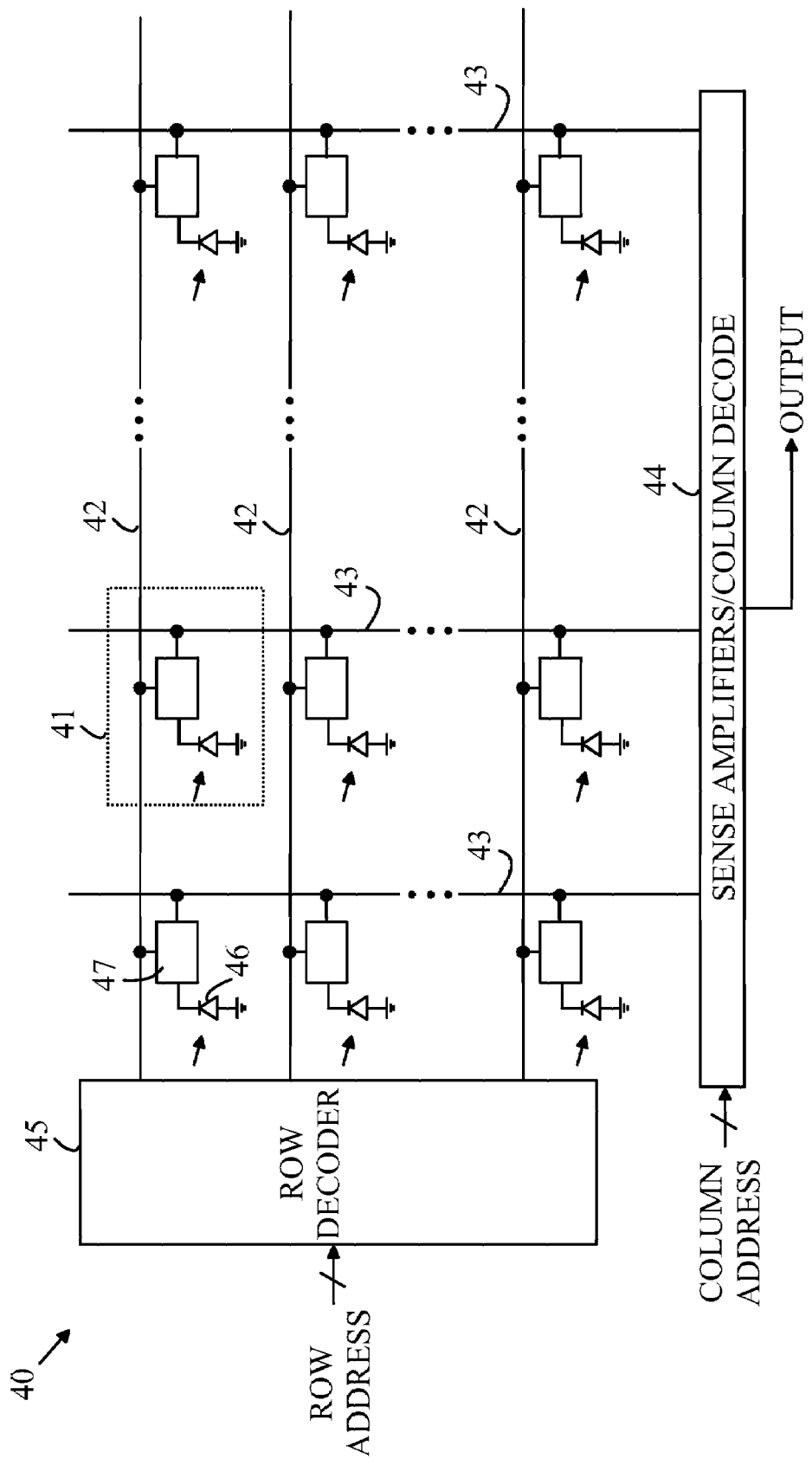
FIG. 3 is a schematic drawing of a prior art CMOS imaging array of the type normally used with dental sensor 30.

The manner in which the present invention provides its advantages can be more easily understood with reference to FIGS. 1 and 2, which illustrate a prior art dental sensor. FIG. 1 is a top view of dental sensor 30, and FIG. 2 is a cross-sectional view through line 2-2 shown in FIG. 1. Dental sensor 30 includes a layer 32 of scintillation material that converts x-rays to light in the visible region of the spectrum. The light generated in layer 32 is viewed by an image sensor 31 through a channel plate 33 that consists of a bundle of optical fibers that map the surface of the scintillation material onto image sensor 31. Sensor 30 is placed inside the patient's mouth and held in place by the patient biting down on tab 34. When x-rays from a source outside the mouth impinge on sensor 30 after passing through the patient's teeth, the x-rays strike layer 32. Each interaction between an X-ray and the material of layer 32 results in multiple visible photons being generated. The photons are emitted in all directions. Channel plate 33 blocks photons that are traveling in directions other than that defined by the aperture of the optical fibers shown at 35. Channel plate 33 is made primarily of metal-doped glass fibers. The metal-doped glass absorbs x-rays that escape from the scintillation layer without being converted. The thickness of the glass is chosen such that the number of x-rays that reach sensor 31 is reduced to the point that interactions between the x-rays and the pixels in sensor 31 are rare.

Refer now to FIG. 3, which is a schematic drawing of a prior art CMOS imaging array of the type normally used with dental sensor 30. Imaging array 40 is constructed from a rectangular array of pixel sensors 41. Each pixel sensor includes a photodiode 46 and an interface circuit 47. The details of the interface circuit depend on the particular pixel design. However, all of the pixel sensors include a gate that is connected to a row line 42 that is used to connect that pixel sensor to a bit line 43. The specific row that is enabled at any time is determined by a row address that is input to a row decoder 45. The row select lines are a parallel array of conductors that run horizontally in the metal layers over the substrate in which the photodiodes and interface circuitry are constructed.

The various bit lines terminate in a column processing circuit 44 that typically includes sense amplifiers and column decoders. The bit lines are a parallel array of conductors that run vertically in the metal layers over the substrate in which the photodiode and interface circuitry are constructed. Each sense amplifier reads the signal produced by the pixel that is currently connected to the bit line processed by that sense amplifier. The sense amplifiers may generate a digital output signal by utilizing an analog-to-digital converter (ADC). At any given time, a single pixel sensor is readout from the imaging array. The specific column that is readout is determined by a column address that is utilized by a column decoder to connect the sense amplifier/ADC output from that column to circuitry that is external to the imaging array.

To provide low noise, all of the electrons must be removed from the photodiodes when the photodiodes are reset at the beginning of an exposure. To assure complete reset, pinned photodiodes are utilized. In a pinned photodiode, the electrons generated by the photons are stored in a potential well that is at a lower potential than the region in which the charge is generated. The storage region is adjacent to a gate transistor. When the gate transistor is placed in a conductive state, all of the charge moves out of the gate, and hence, the photodiode can be reset. As noted above, however, large area pinned photodiodes are difficult to construct in CMOS because complete charge transfer out of the pinned photodiode becomes difficult as the area of the photodiode is increased, and hence, pinned photodiodes are limited to sizes of the order of 6 μm. Without complete charge transfer, the sensor will suffer from image lag, a phenomena where an image from the previous frame is visible in the current frame, and the picture looks blurry if the object is moving from frame to frame.

Figure 4:
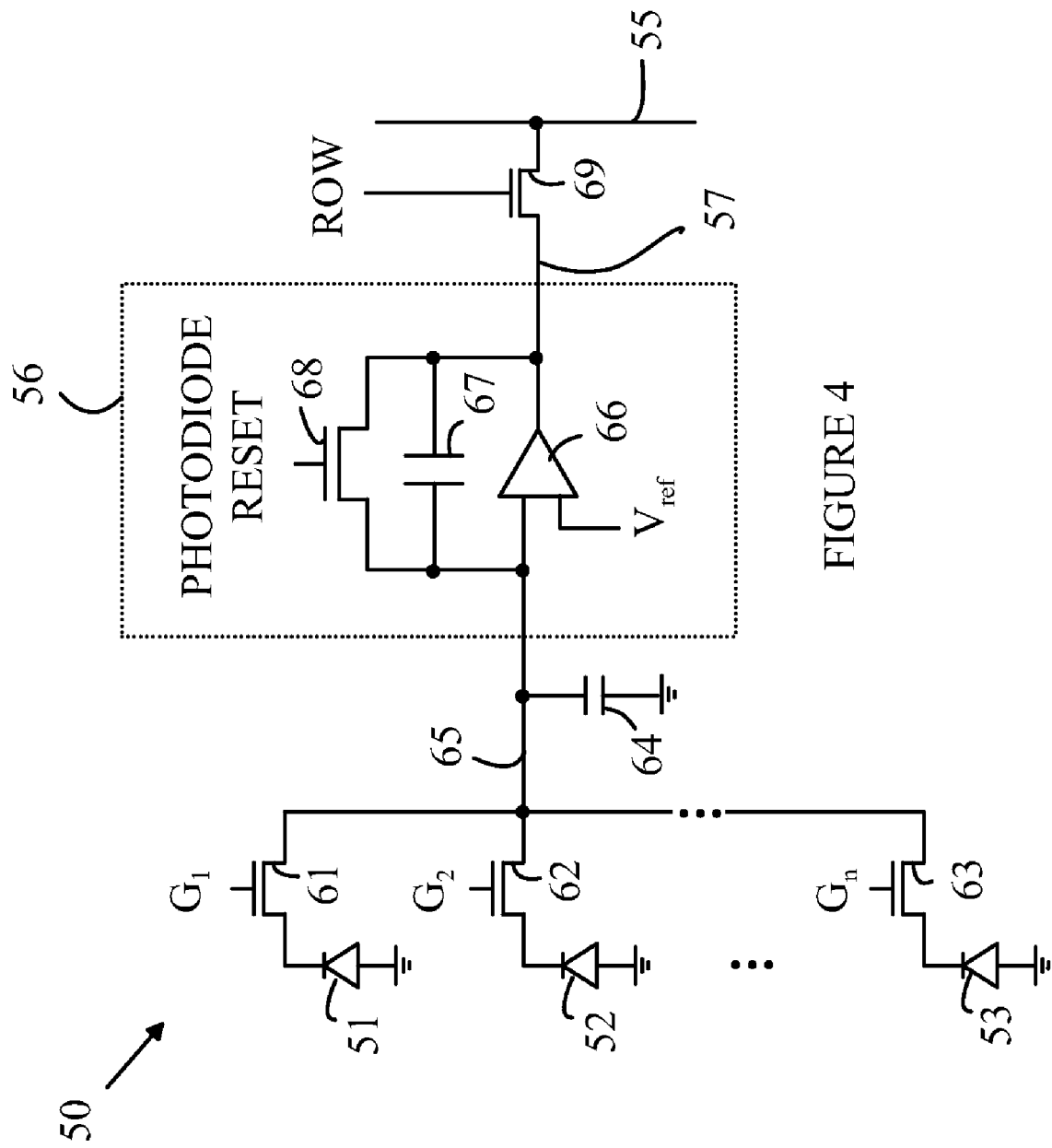
FIG. 4 illustrates one embodiment of a pixel sensor for use in an imaging array having the general organization of the array shown in FIG. 3.

Refer now to FIG. 4, which illustrates one embodiment of a pixel for use in an imaging array having the general organization of the array shown in FIG. 3. Pixel 50 can be used in place of the pixels shown at 41 in the array shown in FIG. 3. Pixel 50 includes n pinned photodiodes, where n is greater than 1. Exemplary photodiodes are shown at 51-53. The size of the photodiodes is set to be less than 6 μm so as to avoid the problems discussed above in implementing large pinned photodiodes in CMOS.

Each photodiode is coupled to node 65 by a gate transistor; the gate transistors corresponding to photodiodes 51-53 are shown at 61-63, respectively. Charge that is transferred from the photodiodes is stored on capacitor 64. The charge that is stored on capacitor 64 is converted to a voltage at node 57 by transimpedance amplifier 56. This voltage is readout on bit line 55 when a row signal is asserted to gate 69.

In practice, the photodiodes are reset at the beginning of each exposure by placing the gate transistors in the conducting state and connecting the output of amplifier 66 to the input by closing switch 68. After the photodiodes have been reset, the gate transistors are placed in the non-conducting state and switch 68 is opened. The photodiode array is then exposed to the image that is to be recorded. At the end of the exposure, the charge stored in each pixel is readout. In this simple embodiment, the charge in each pixel is dumped onto capacitor 64 by placing the gate transistors in the conducting state. The summed charge on capacitor 64 is then converted to a voltage on node 57 by transimpedance amplifier 56 and readout via bit line 55.

There is a limit to the dynamic range of the transimpedance amplifier, and hence, to the dynamic range of the pixel values that can be generated from pixel 50. If the amplifier gain is set to a high value by using a small capacitor for capacitor 67, then the amplifier will saturate in pixels that are exposed to high light levels. Similarly, if the gain is set to a low value, there will be insufficient signals in pixels that are exposed to low light levels. The dynamic range of the pixel can be expanded by varying the number of photodiodes whose charge is emptied onto capacitor 64 depending on the voltage on node 57.

Figure 5:
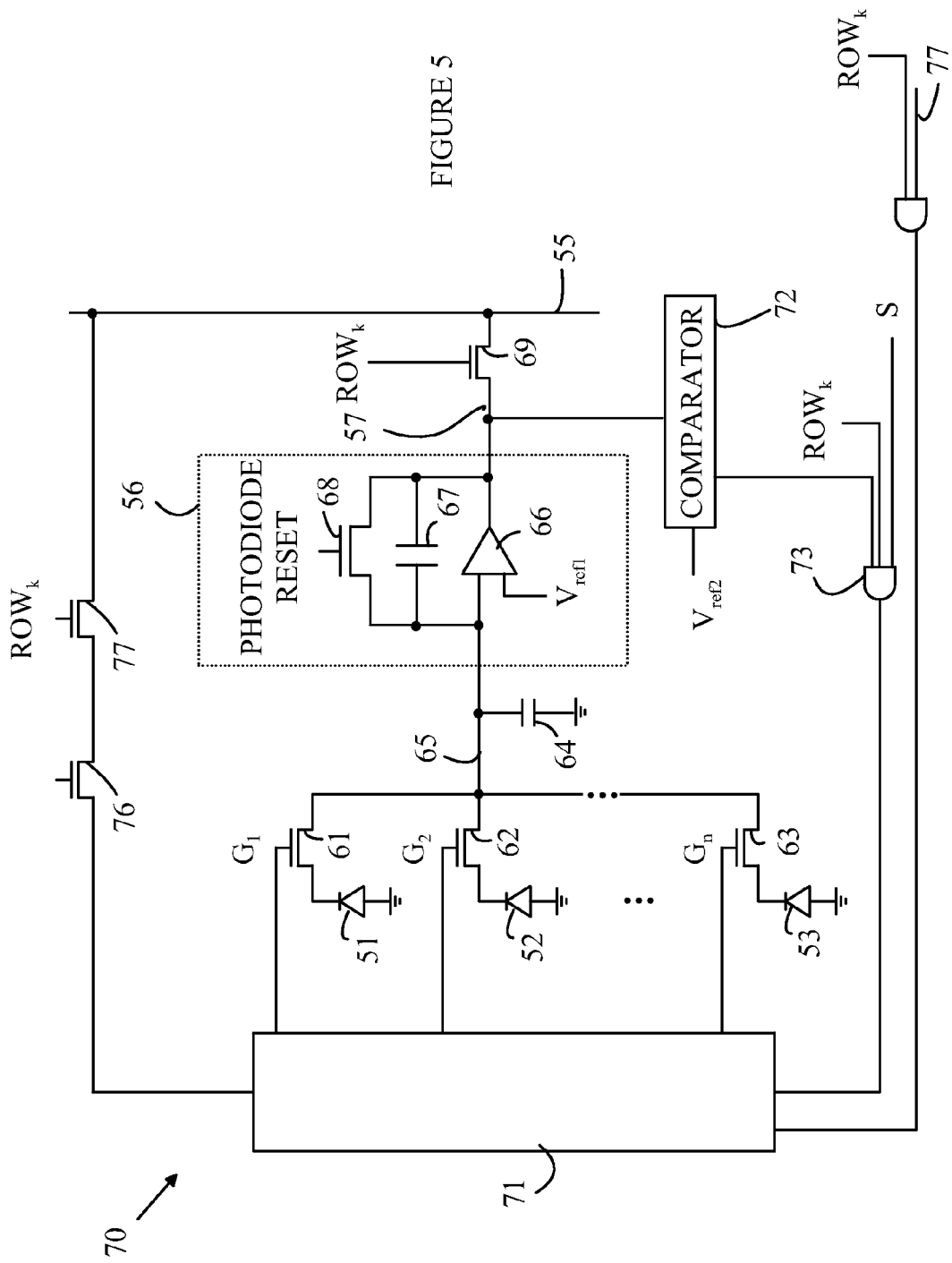
FIG. 5 illustrates another embodiment of a pixel sensor according to the present invention.

Refer now to FIG. 5, which illustrates another embodiment of a pixel according to the present invention. Pixel 70 differs from pixel 50 discussed above in that the gate transistors are controlled from a shift register 71. At the beginning of the readout cycle, a 1 is shifted into shift register 71 on line 77. During readout of the photodiodes, a shift signal S is applied to shift register 71, which has been loaded with this single bit. Each gate transistor is connected to a corresponding bit in the shift register. Hence, the charge stored in each photodiode will be dumped onto capacitor 64 when the 1 is shifted to the bit corresponding to the gate transistor associated with that photodiode. The same shift signal is applied to all of the pixels in the currently selected row. A comparator 72 compares the voltage at node 57 with a reference voltage $V_{ref2}$. If the voltage exceeds the reference voltage, gate 73 blocks any further shift pulses from being input to shift register 71.

In one embodiment, the photodiodes are all of equal size. Hence, to reconstruct the light level at the pixel, the voltage at node 57 and the number of photodiodes that contributed to that voltage must be known. One method for determining the number of photodiodes that contributed to the signal readout on bit line 55 is to continue shifting register 71 after the voltage on node 57 has been read out. After the readout, the input to amplifier 66 is reset by closing switch 68. This will cause the potential at node 57 to be reduced below the comparator threshold. In addition, the output of shift register 71 is connected to the bit line by closing switch 76. The shift pulses are then continued and the pulse on which the 1 in shift register 71 is switched onto bit line 55 is recorded. This pulse defines the position of the 1 in the shift register when the comparator threshold was reached and further shifts blocked, and hence, determines the number of photodiodes that contributed to the voltage that was readout.

To reset pixel 70 all of the gate transistors must be placed in the conducting state at the same time and switch 69 closed. This can be accomplished by loading all "1s" into shift register 71.

The above-described embodiments are readout one row at a time in a scheme in which the analog signal generated by the amplifier is digitized by an analog-to-digital converter attached to the bit line in each of the columns. Hence, the readout time is increased by the number of rows that must be readout, since the conversion of the charge in any given row cannot start until that row is selected. In addition, the power consumption is increased since the pixel amplifier needs to drive higher parasitic capacitance of the bit line.

Figure 6:
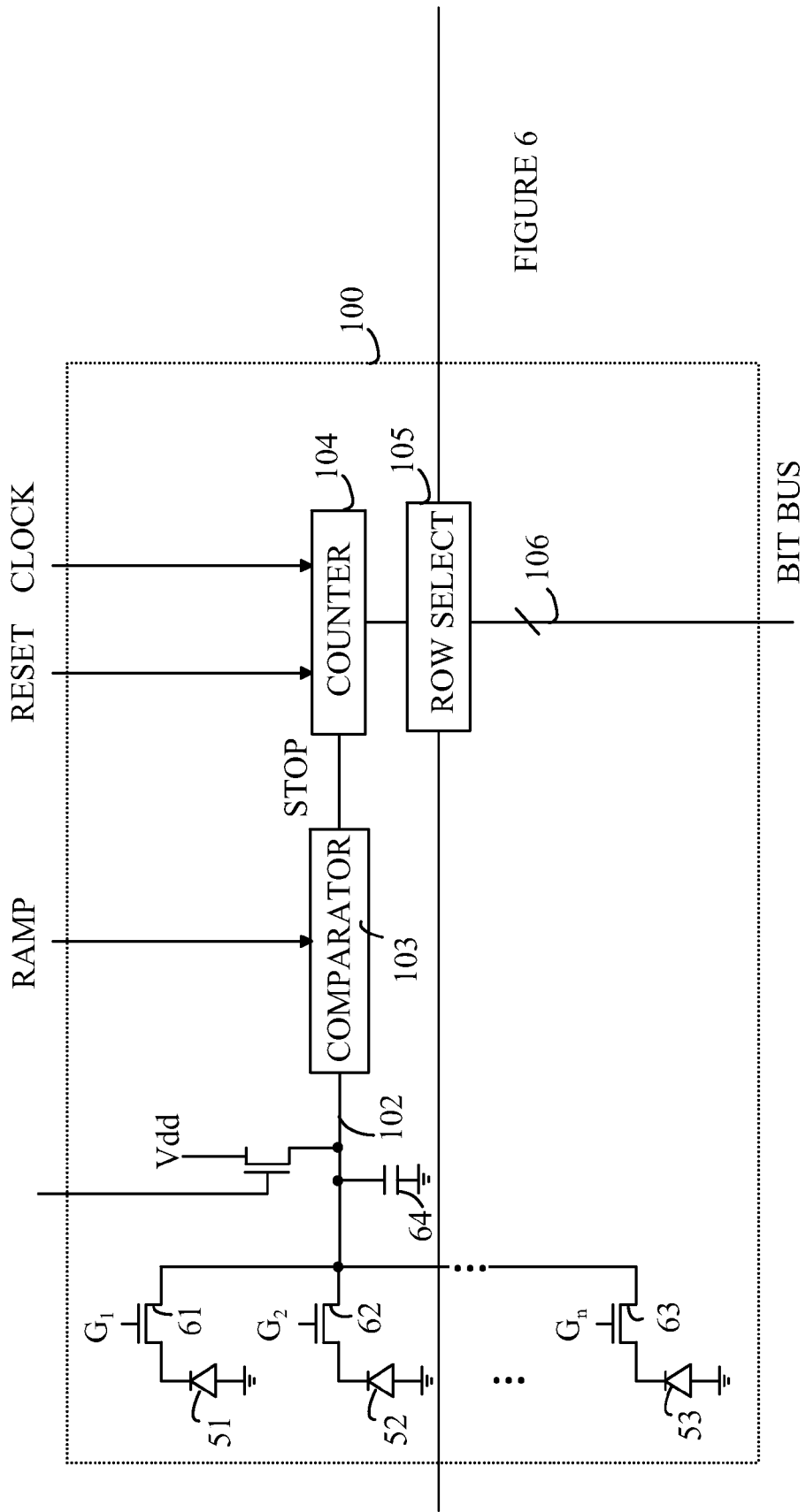
FIG. 6 is a schematic drawing of a pixel sensor that utilizes a distributed analog-to-digital converter according to one embodiment of the present invention.

One method for improving the readout speed and reduce the power that must be provided in each pixel is to include an analog-to-digital converter in each image pixel. Refer now to FIG. 6, which is a schematic drawing of a pixel sensor that utilizes a distributed analog-to-digital converter according to one embodiment of the present invention.

Pixel sensor 100 includes a plurality of pinned photodiodes 51-53 that are connected to capacitor 64 by transfer gates 61-63, respectively. After the pixels in the array containing pixel sensor 100 have been exposed, the charge on each of the photodiodes is transferred to capacitor 64 and then digitized. At the start of the digitization process, counter 104 is reset and begins to count clock pulses while the potential on the other input of the comparator 103 is increased. The potential on the ramp line is linearly related to the count that has accumulated in counter 104. When the ramp potential is equal to the potential at node 102, the comparator 103 generates a stop signal that is applied to counter 104. Hence, counter 104 is left with a count that is related to the potential at node 102.

After all of the pixels have been digitized in this manner, the pixels are readout one row at a time using a row decoder that operates a set of row select switches 105 that connect the counter output to a bit bus 106, which serves a function analogous to the bit lines described above, except that the signal on the bit line is in digital format instead of the analog format described above. In this embodiment, the bit bus includes one line per bit in counter 104. Hence, the counter is readout in parallel down bit bus 106. While this embodiment utilizes a bit bus that reads out the counter bits in parallel, embodiments in which the bits in the counter are shifted down a single conductor bit line can also be constructed.

It should be noted that all of the data stored as an analog charge in the pixels is digitized at the same time; hence, the analog-to-digital conversion of the data is reduced to the time needed to readout one row in embodiments using an analog-to-digital converter at each bit line. In addition, the comparator requires less power gain than the transimpedance amplifier used in the analog readout embodiments.

Figure 7:
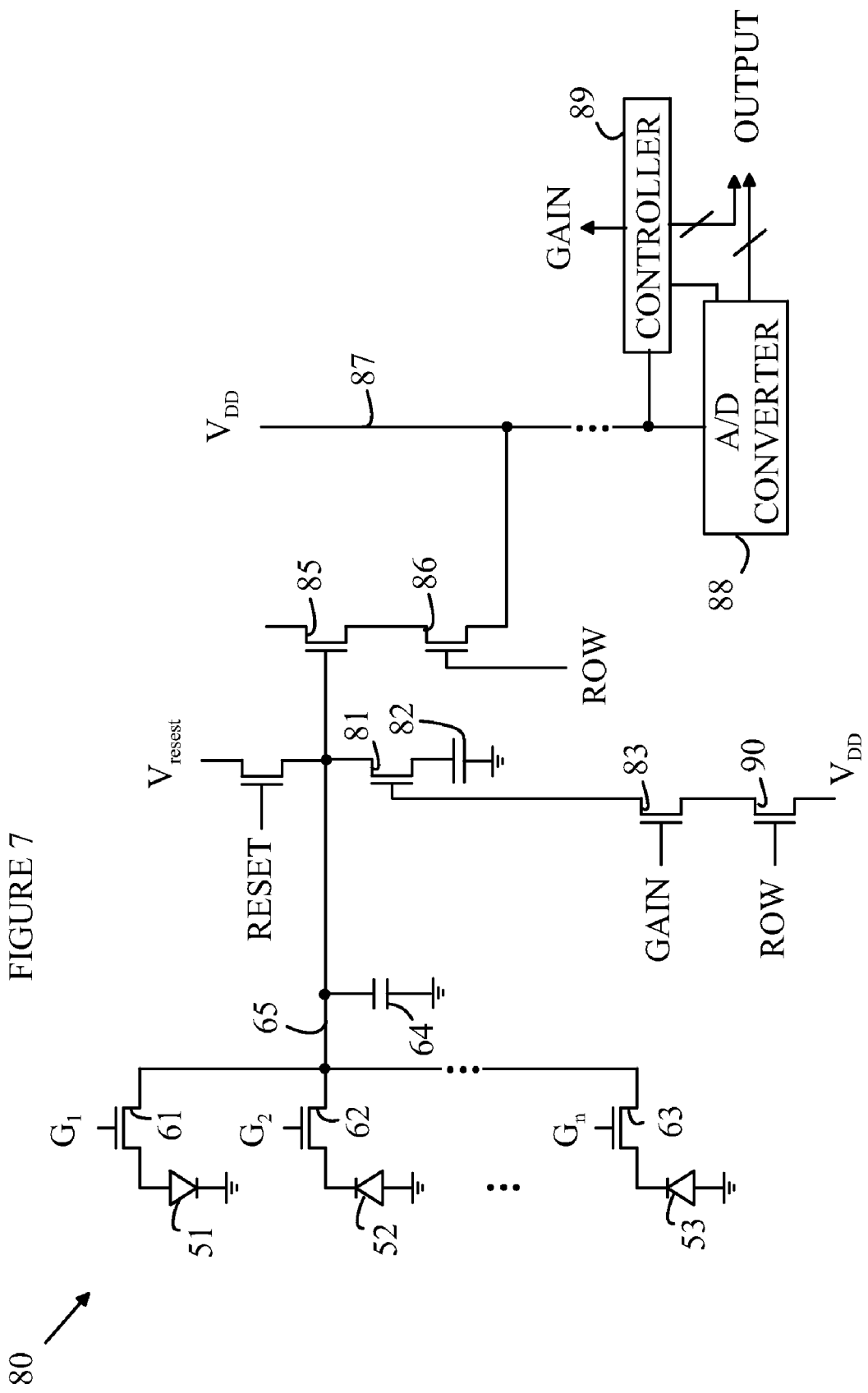
FIG. 7 illustrates another embodiment of a pixel sensor according to the present invention.

The dynamic range of each pixel can also be increased by including a mechanism for altering the gain of the active device that converts the charge from the photodiodes to a voltage. Refer now to FIG. 7, which illustrates another embodiment of a pixel sensor according to the present invention. Pixel sensor 80 utilizes a single transistor 85 that operates in a source follower mode to convert the charge from the photodiodes to a voltage that is switched onto bit line 87 in response to a row select signal being applied to transistor 86. The conversion gain is set by the capacitance between node 65 and ground, the smaller the capacitance, the higher the gain. In general, capacitor 64 is the parasitic capacitance of node 65. This capacitance sets the maximum charge to voltage conversion ratio. For bright pixels, the amount of charge generated by the photodiodes could exceed the charge conversion capacity of the source follower. In the above-described embodiments, this situation was handled by converting only a subset of the charge stored in the photodiodes. In pixel sensor 80, the conversion gain can be lowered by switching a second capacitor 82 onto node 65 utilizing transistors 81 and 83. The additional capacitance reduces the charge-to-voltage conversion ratio, and hence, avoids saturation of source follower 85.

The gain control line is shared by each pixel in a given column of pixels; hence a second gate transistor 90 is used to assure that the gain is only altered on the pixel in the row that is currently selected. The gain control signal is generated by controller 89, which monitors the voltage on bit line 87 during the readout process and controls analog-to-digital converter 88. If the voltage on bit line 87 exceeds a predetermined threshold value, controller 89 sets the gain control signal to cause capacitor 82 to be switched onto node 65. The value of the gain control signal is also output as the most significant bit of the digitized pixel charge value. In this embodiment, all or only part of the charge stored in the individual photodiodes could be utilized to further increase the dynamic range of pixel sensor 80. If the pixels are individually switched, controller 89 could also supply the pixel control signals and keep track of the number of pixels that contributed to the final pixel value. The number of pixels would also be output by controller 89 so that the data could be converted to a single number representing the light intensity on pixel 80.

The embodiments of the present invention described above utilize a photodiode to convert the light incident on each pixel to a charge. However, other forms of photosensor such as a phototransistor could be utilized.

Various modifications to the present invention will become apparent to those skilled in the art from the foregoing description and accompanying drawings. Accordingly, the present invention is to be limited solely by the scope of the following claims.

What is claimed is:

1. An image sensor comprising:
   an output bus;
   a two-dimensional array of pixel sensors, each pixel sensor comprising:
      a capacitor;
      a plurality of light sensors, each light sensor comprising a photodiode and a photodiode gate transistor for connecting said photodiode to said capacitor;
      a charge converter that generates an output signal on an output node, said output signal being determined by a charge on said capacitor; and
      a transfer gate that connects said output node to said output bus; and
   a layer of scintillation material adjacent to said array, said scintillation material emitting light in response to x-rays impinging thereon, said light being detected by said pixel sensors;
   wherein said photodiodes are pinned photodiodes of a light sensing area no greater than 6 μm by 6 μm; and
   wherein each of said pixel sensors has a light sensing area significantly greater than 36 μm².

2. The image sensor of claim 1 further comprising a controller that reads out data stored in said array of pixel sensors after said array of pixel sensors has been exposed to an image, said controller causing selected ones of said photodiode gate transistors to enter a conductive state in each of said pixel sensors to transfer charge from said photodiode to said capacitor, and then operating said transfer gates to connect said output signal of each of said pixel sensors to said output bus, wherein at least one of said pixel sensors has two photodiode gate transistors in said conductive state during said readout, the number of photodiode gate transistors in said conductive state depending on a light intensity received by said one of said pixel sensors and varying from exposure to exposure.

3. The image sensor of claim 1 wherein said charge converter comprises a transimpedance amplifier.

4. The image sensor of claim 1 wherein said charge converter comprises;
   a comparator that compares a signal on said capacitor with a reference voltage, said comparator generating a stop signal when said signal voltage is in a predetermined relationship with said reference voltage; and
   a counter that counts pulses from a clock input until said stop signal is generated, said counter storing a digital count value, said count value being output on said output bus.

5. The image sensor of claim 1 wherein all of said photodiode gate transistors in one of said pixel sensors are placed in said conductive state during said readout.

6. An image sensor comprising:
   an output bus;
   a two-dimensional array of pixel sensors, each pixel sensor comprising:
      a capacitor;
      a plurality of light sensors, each light sensor comprising a photodiode and a photodiode gate transistor for connecting said photodiode to said capacitor;
      a charge converter that generates an output signal on an output node, said output signal being determined by a charge on said capacitor; and
      a transfer gate that connects said output node to said output bus; and
   a layer of scintillation material adjacent to said array, said scintillation material emitting light in response to x-rays impinging thereon, said light being detected by said pixel sensors;
   wherein said charge converter comprises:
      a source follower having a gate connected to said output node and an output that is connected to a bit line in response to a row select signal;
      a gain switch for causing a capacitor to be connected between said output node and a power rail in response to a gain control signal and said row select signal; and
      a controller that monitors said bit line and generates said gain control signal if a potential on said bit line exceeds a threshold value.

7. An image sensor comprising:
   an output bus;
   a two-dimensional array of pixel sensors, each pixel sensor comprising:
      a capacitor;
      a plurality of light sensors, each light sensor comprising a photodiode and a photodiode gate transistor for connecting said photodiode to said capacitor;
      a charge converter that generates an output signal on an output node, said output signal being determined by a charge on said capacitor; and
      a transfer gate that connects said output node to said output bus; and
   a layer of scintillation material adjacent to said array, said scintillation material emitting light in response to x-rays impinging thereon, said light being detected by said pixel sensors;
   wherein said pixel sensors further comprise a comparator that compares a voltage on said output node with a reference voltage, said photodiode gate transistors that are placed in said conductive state being determined by an output signal generated by said comparator.

8. An image sensor comprising:
   an output bus;
   a two-dimensional array of pixel sensors, each pixel sensor comprising:
      a capacitor;
      a plurality of light sensors, each light sensor comprising a photodiode and a photodiode gate transistor for connecting said photodiode to said capacitor;
      a charge converter that generates an output signal on an output node, said output signal being determined by a charge on said capacitor; and
      a transfer gate that connects said output node to said output bus;
   a layer of scintillation material adjacent to said array, said scintillation material emitting light in response to x-rays impinging thereon, said light being detected by said pixel sensors; and
   a controller that reads out data stored in said array of pixel sensors, said controller causing selected ones of said photodiode gate transistors to enter a conductive state in each of said pixel sensors to transfer charge from said photodiode to said capacitor, and then operating said transfer gates to connect said output signal of each of said pixel sensors to said output bus, wherein at least one of said pixel sensors has two photodiode gate transistors in said conductive state during said readout;

wherein said controller also outputs a value specifying the number of said photodiode gate transistors that were in said conductive state during said readout.

9. A method for generating an x-ray image, said method comprising:
provide a layer of scintillation material overlying a two-dimensional array of pixel sensors in which each pixel sensor comprises a plurality of light sensors, each light sensor comprising a photodiode and a photodiode gate transistor for connecting said photodiode to a capacitor in said pixel sensor;

exposing said layer of scintillation material to an x-ray image;

generating data indicative of a charge stored in said pixel sensors, wherein said data is generated for each pixel sensor by;

transferring charge from said photodiodes in said pixel sensor to a capacitor in said pixel sensor;

converting said transferred charge to a signal representative of said transferred charge; and transferring said signal to a bus in said array of pixel sensors, wherein at least one of said pixel sensors charge is transferred from a plurality of photodiodes prior to converting said transferred charge; and wherein said photodiodes are pinned photodiodes, of size no greater than 6 μm by 6 μm; and wherein each of said pixel sensors has a light sensing area significantly greater than 36 μm².

10. A method for generating an x-ray image, said method comprising:
providing a layer of scintillation material overlying a two-dimensional array of pixel sensors in which each pixel sensor comprises:
a plurality of light sensors, each sensor comprising a photodiode and a photodiode gate transistor for connecting said photodiode to a capacitor in said pixel sensor;

exposing said layer of scintillation material to an x-ray image;

generating data indicative of a charge stored in said pixel sensors, wherein said data is generated for each pixel sensor by;

transferring charge from said photodiodes in said pixel sensor to a capacitor in said pixel sensor;

converting said transferred charge to a signal representative of said transferred charge; and transferring said signal to a bus in said array of pixel sensors, wherein at least one of said pixel sensors charge is transferred from a plurality of photodiodes prior to converting said transferred charge; and wherein said charge stored in each photodiode is selectively transferred to said capacitor depending on a charge already on said capacitor and wherein a signal representing the number of photodiodes for which charge was transferred to said capacitor is also output on said bus.

11. The method of claim 10 wherein said photodiodes are sequentially connected to said capacitor and wherein said sequential connection is interrupted when said capacitor has a charge greater than a predetermined charge.

12. A method for generating an x-ray image, said method comprising:
providing a layer of scintillation material overlying a two-dimensional away of pixel sensors in which each pixel sensor comprises a plurality of light sensors, each sensor comprising a photodiode and a photodiode gate transistor for connecting said photodiode to a capacitor in said pixel sensor;

exposing said layer of scintillation material to an x-ray image;

generating data indicative of a charge stored in said pixel sensors, wherein said data is generated for each pixel sensor by:

transferring charge from said photodiodes in said pixel sensor to a capacitor in said pixel sensor;

converting said transferred charge to a signal representative of said transferred charge;

transferring said signal to a bus in said array of pixel sensors, and altering the gain of a charge to voltage converter in said pixel in response to a measurement of said signal on said bus;

wherein at least one of said pixel sensors charge is transferred from a plurality of photodiodes prior to converting said transferred charge.

13. The method of claim 12 wherein said gain is altered by increasing a capacitance on an input to a source follower that converts said charge to said signal representative of said transferred charge.

* * * * *